(12) United States Patent
Uvieghara (10) Patent No.: US 7,245,546 B2
(45) Date of Patent: Jul. 17, 2007

(54) REDUCED AREA, REDUCED PROGRAMMING VOLTAGE CMOS EFUSE-BASED SCANNABLE NON-VOLATILE MEMORY BITCELL

(75) Inventor: Gregory A. Uvieghara, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 11/430,625

(22) Filed: May 9, 2006

(65) Prior Publication Data
US 2006/0203593 A1  Sep. 14, 2006

Related U.S. Application Data

(62) Division of application No. 10/877,121, filed on Jun. 25, 2004.

(51) Int. Cl.
*G11C 17/18* (2006.01)
(52) U.S. Cl. .............................. 365/225.7; 365/185.05; 365/185.06
(58) Field of Classification Search ............. 365/225.7, 365/189.05, 189.06
See application file for complete search history.

(56) References Cited

U.S. PATENT DOCUMENTS

| 4,864,165 | A  | * | 9/1989 | Hoberman et al. ........... 362/16 |
| 6,021,078 | A  | * | 2/2000 | Le et al. .................. 365/225.7 |
| 6,301,164 | B1 | * | 10/2001 | Manning et al. ............ 365/200 |
| 7,054,206 | B2 | * | 5/2006 | Tellier ....................... 365/200 |

* cited by examiner

*Primary Examiner*—Tuan T. Nguyen
(74) *Attorney, Agent, or Firm*—Thomas Rouse; Charles D. Brown; Howard H. Seo (57) ABSTRACT

An integrated circuit chip includes a number of memory bitcells. Each bitcell includes: a latch having a sense node; a programming transistor having an efficient saturation region of operation; and a fuse connected to the programming transistor at a first terminal of the fuse. A programming voltage can be supplied to the fuse at a second terminal of the fuse; and a logic gate circuit is connected to the gate of the programming transistor. The logic gate circuit is operated at the programming voltage so that the logic gate circuit drives the programming transistor in the efficient saturation region when programming the fuse. The bitcell also includes a fuse-sensing circuit having no more than one transistor. Operation in the efficient saturation region allows the programming transistor to be small. Combined with using no more than one sensing transistor, significant reduction in area of the bitcells on the chip is achieved.

14 Claims, 5 Drawing Sheets

REDUCED AREA, REDUCED PROGRAMMING VOLTAGE CMOS EFUSE-BASED SCANNABLE NON-VOLATILE MEMORY BITCELL

The present Application for Patent is a divisional of patent application Ser. No. 10/877,121 entitled "REDUCED AREA, REDUCED PROGRAMMING VOLTAGE CMOS EFUSE-BASED SCANNABLE NON-VOLATILE MEMORY BITCELL" filed Jun. 25, 2004, pending, and assigned to the assignee hereof and hereby expressly incorporated by reference herein.

BACKGROUND

The present invention generally relates to electronic devices and integrated circuit chips and, more particularly, to non-volatile, electronically programmable memory for integrated circuit electronic devices.

There are several uses and applications for an electronic fuse, sometimes referred to in the art as an "eFUSE", including, for example, array redundancy for large cache memories in microprocessor chips, electronic chip identification, part number identification, and thermal diode calibration. In a redundancy application, for example, chips returned from fabrication are usually tested and a certain percentage of them are usually found to be bad, for example, from random contingencies that may occur in the fabrication process. The percentage of good, usable chips is commonly referred to as the "yield". Redundancy may enable programming a chip at the testing phase so that flawed portions of the chip are not used in favor of unflawed redundant portions, thereby increasing the yield and decreasing the percentage of chips that must be thrown away as unusable. Most of the applications for electronic fuses combine the electronic fuse with the use of a memory in some way, for example, as part of a memory bitcell. For example, in electronic chip identification or part number identification, an electronic fuse may be used to "program" or write information into a non-volatile memory, which may be comprised of memory bitcells, and the information can then be read from the memory as a unique chip identifier or part number identifier. Also, for example, in thermal diode calibration, a non-volatile memory programmed using electronic fuses can be used to hold a test temperature and the thermal diode voltage read at the test temperature.

Figure 1:
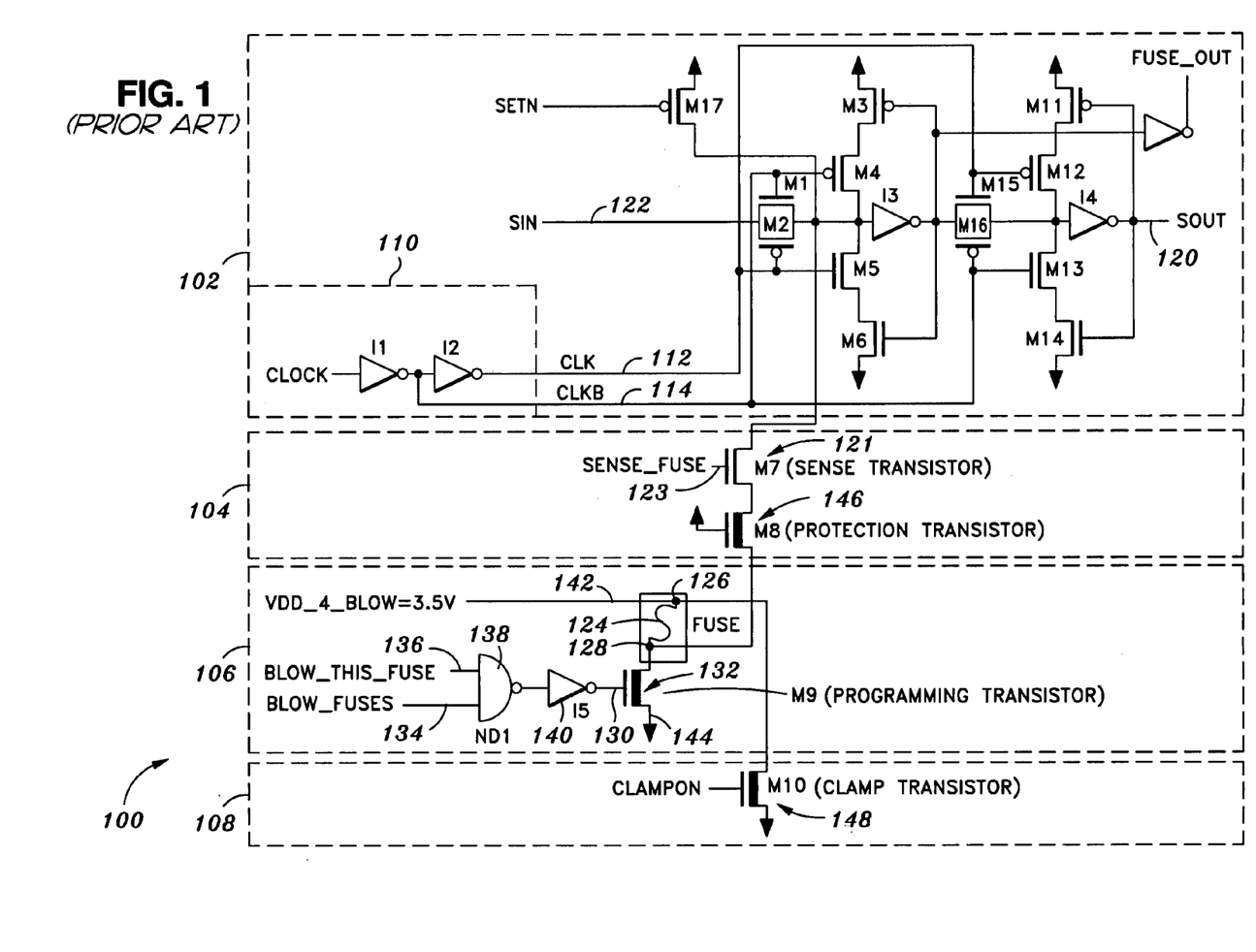
FIG. 1 is a schematic circuit diagram illustrating a prior art memory bitcell.
Figure 2:
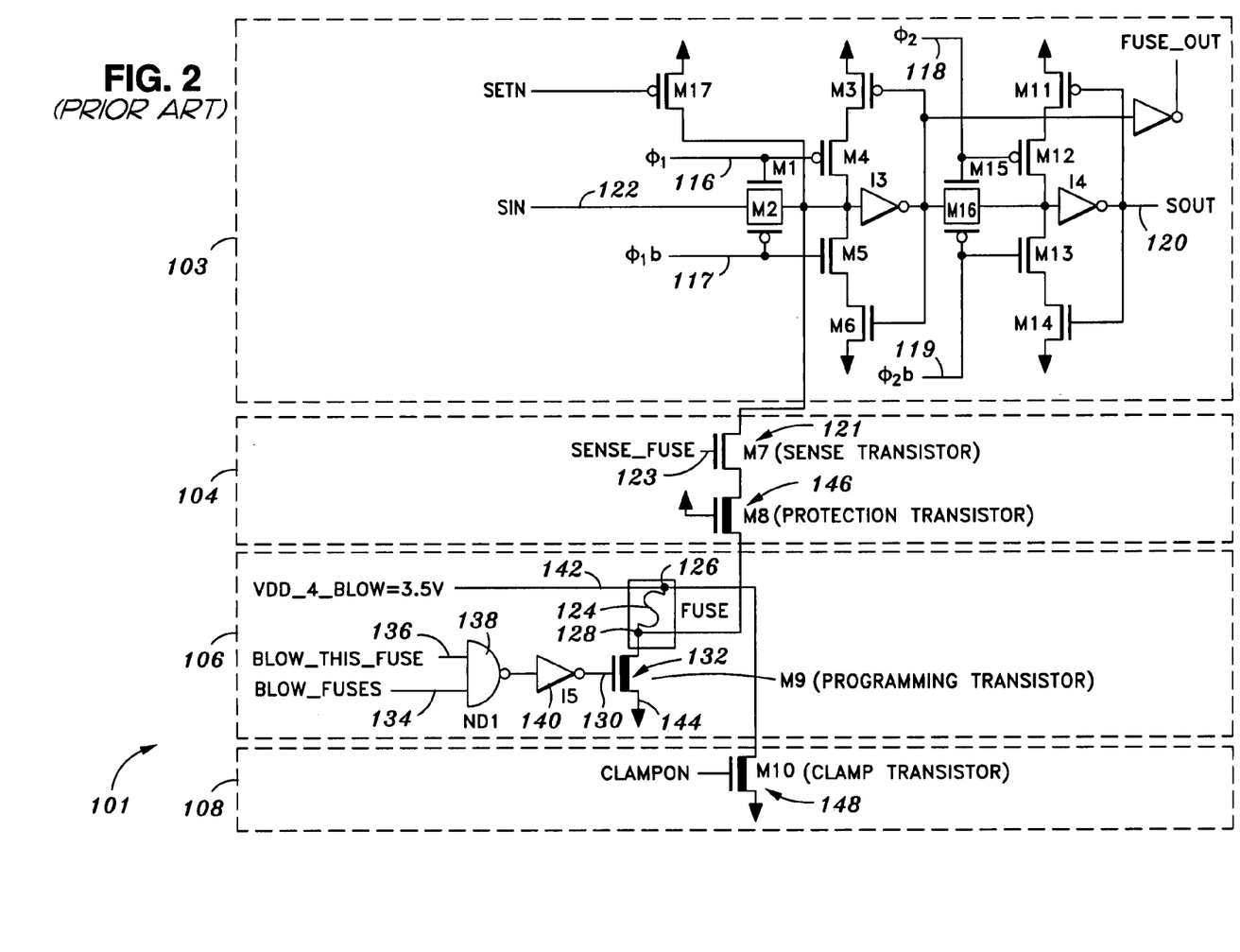
FIG. 2 is a schematic circuit diagram illustrating a prior art memory bitcell.

FIG. 1 shows a prior art memory bitcell 100 for writing, storing, and reading one bit of information. Memory bitcell 100 may include circuitry for a scannable flip-flop, or latch, 102, fuse-sensing circuitry 104, fuse-programming circuitry 106, and clamp circuitry 108. Memory bitcell 100 may also include a clock buffer 110, which may provide a clock signal 112 and a complement 114 of clock signal 112 from a single phase clock. FIG. 2 shows another memory bitcell 101, which may use two-phase clock signaling as opposed to the single phase clock signaling used by the memory bitcell 100 shown in FIG. 1. Memory bitcell 101 is similar to memory bitcell 100 and may include scannable flip-flop or latch 103, fuse-sensing circuitry 104, fuse-programming circuitry 106, and clamp circuitry 108. Circuitry for latch 103 may be similar to circuitry for latch 102 except that latch 103 may be driven by two-phase clocks providing clock signal 116 (labeled $\phi_1$ in FIG. 2) and its complement 117 ($\phi_1 b$) and clock signal 118 ($\phi_2$) and its complement 119 ($\phi_2 b$).

Referring now to both FIGS. 1 and 2, when sense transistor 121 ("M7") is turned off, for example, by providing an appropriate voltage at its gate 123 ("SENSE_FUSE")—also referred to as SENSE_FUSE being set to "off"—latches 102, 103 may be operated independently of the rest of the circuitry—such as fuse-sensing circuitry 104, fuse-programming circuitry 106, and clamp circuitry 108—latches 102, 103 being effectively isolated when transistor 121 is off. For example, with transistor 121 turned off, either of latches 102, 103 may be operated as a scannable flip-flop. For example, a given number, say 64, of latches 102 may be chained together, the output 120 ("SOUT") of a given latch 102 being connected to the input 122 ("SIN") of the next latch 102 in line. Then the chain of latches 102, in this case 64 latches 102, will store a sequence of bits fed into the input 122 of the first latch 102, referred to as "scanning in" the sequence; the chain of latches 102 may be referred to as a "scan chain". In this example, only the most recently entered 64 bits of any sequence entered will be stored because there are only 64 latches 102 chained together.

Fuse-programming circuitry 106 of memory bitcells 100, 101 may include a fuse 124. Fuse 124 may be fabricated, for example, using polysilicon with a metalized layer of silicide on top, as known in the art. Memory bitcells 100, 101 may be programmed, e.g., a sequence that has been scanned in may be permanently, or nonvolatilely, stored, by either blowing or not blowing fuse 124. Fuse 124 may be blown, for example, by providing sufficient voltage across the fuse and current flow through the fuse to destroy the fuse or alter its electrical properties, e.g., the resistance, of the fuse. For example, an unblown fuse may have a nominal resistance of about 100 ohms between terminals 126 and 128 of fuse 124, and a blown fuse may have a nominal resistance of about 5,000 ohms between terminals 126 and 128. Then, for example, a memory bitcell 100 or 101 with a blown fuse may be used to nonvolatilely store a "0" bit, and a memory bitcell 100 or 101 with an unblown fuse may be used to nonvolatilely store a "1" bit (or vice versa depending on the logic representation being used).

Fuse 124 may be programmed by providing an appropriate "on" or "off" signal at gate 130 of programming transistor 132 ("M9"). The signal at gate 130 may be provided, for example, as an AND operation of two inputs 134 and 136 by AND logic provided by NAND gate 138 and inverter 140. Input 134, for example, may be provided to all fuses simultaneously, e.g., all fuses for a chain of latches 102 as described above, so that because of the AND logic any particular fuse may be blown only when both input 134 is high and the distinct input 136 for that particular fuse is also high. Thus, programming only occurs when input 134 is high and accidental blowing of fuses from high inputs 136 may be prevented when input 134 is low. Assuming that it is desired to blow fuse 124, both inputs 134 and 136 may be set high, producing a high or "on" signal at gate 130 of programming transistor 132, allowing transistor 132 to conduct so that voltage 142 ("VDD_4_BLOW") may be applied at terminal 126 of fuse 124 and cause current to flow through fuse 124 and transistor 132 to node 144, which may be a ground, for example. Sense transistor 121 and clamp transistor 148 should be off during fuse programming operations.

In order to blow the fuse, 10 milliamps (mA) of current is typically required to flow through the fuse 124 and transistor 132. Conventional memory bitcells—such as bitcells 100, 101—typically drive the gate 130 of transistor 132 with a voltage of 1.2 volts (V). Therefore, to make 10 mA of current flow through programming transistor 132, the drain voltage of transistor 132 must be raised very high, usually accomplished by making VDD_4_BLOW voltage 142 nominally about 3.5 V and at least in excess of 3.0 V.

Thus, programming transistor 132 operates in its inefficient saturation region during the fuse programming operation.

The relatively high voltage required for blowing the fuse (e.g. VDD_4_BLOW voltage 142) produces several disadvantages. For example, any transistor in electrical proximity to the fuse 124—such as programming transistor 132—must be fabricated as a thick oxide transistor so that damage due to the high voltages and currents associated with fuse 124 can be avoided. (Thick oxide transistors are indicated in the figures by a thick dark band used to represent the channel, and thin oxide transistors are indicated in the figures by a normal thickness line used to represent the channel.) Thus, sense transistor 121 typically requires a protection transistor 146 ("M8") of thick oxide, which may be biased to always be on, and the sole function of which is to electrically isolate and protect sense transistor 121 from fuse 124. Similarly, clamp transistor 148 ("M10") is also typically required to made of thick oxide.

In addition, the relatively high fuse blow programming voltage 142 and consequent high drain voltage on programming transistor 132 (as described above) requires that programming transistor 132 have a large area on the chip. For example, programming transistor 132 typically has a width of about 40 microns and overall bitcell area typically is about 184.85 square microns.

As can be seen, there is a need for a memory bitcell that operates at a lower voltage than prior art memory bitcells. There is also a need for a non-volatile memory that reduces the size of integrated circuit elements used to implement the non-volatile memory.

SUMMARY

In one embodiment, a fuse-programming circuit includes a programming transistor having an efficient saturation region of operation; a fuse connected to the programming transistor at a first terminal of the fuse; and a programming voltage connected to the fuse and connected to drive the programming transistor in the efficient saturation region.

In another embodiment, a memory bitcell includes a programming transistor having an efficient saturation region of operation; a fuse connected to the programming transistor at a first terminal of the fuse; and a connection of the fuse to a programming voltage. The programming voltage is connected to the fuse at a second terminal of the fuse, and the programming voltage is used to drive the programming transistor in the efficient saturation region.

In still another embodiment, a memory bitcell includes a latch circuit having a sense node; a fuse-programming circuit having a fuse with a first terminal connected to a programming voltage; and a fuse-sensing circuit having no more than one transistor. The fuse-sensing circuit has a single sense transistor connected to the sense node and connected to the fuse at a second terminal of the fuse. The bitcell also includes a clamp circuit having a clamp transistor connected at the first terminal of the fuse to the fuse and to the programming voltage.

In yet another embodiment, an integrated circuit chip includes a plurality of memory bitcells. At least one of the plurality of memory bitcells includes: a latch having a sense node; a programming transistor having an efficient saturation region of operation; a fuse connected to the programming transistor at a first terminal of the fuse; a current source providing a programming voltage connected to the fuse at a second terminal of the fuse; and a logic gate circuit connected to the gate of the programming transistor. The logic gate circuit is operated at the programming voltage so that the logic gate circuit drives the programming transistor in the efficient saturation region when programming the fuse. The bitcell also includes a fuse-sensing circuit having no more than one transistor. The fuse-sensing circuit has a single sense transistor connected to the sense node and connected to the fuse at a second terminal of the fuse. The bitcell also includes a clamp circuit having a clamp transistor connected at the first terminal of the fuse to the fuse and to the programming voltage.

In a further embodiment, a non-volatile memory includes means for operating a programming transistor in an efficient saturation region, so that the programming transistor draws a current through a fuse, blowing the fuse.

In a still further embodiment, a method for programming an electronic fuse includes steps of: providing a programming transistor having an efficient saturation region; connecting a fuse to the programming transistor at a first terminal of the fuse; providing a programming voltage at a second terminal of the fuse; and operating the programming transistor in the efficient saturation region.

In a yet further embodiment, a method for programming and sensing a non-volatile memory includes a step for providing a logic signal to a programming transistor; and a step for operating the programming transistor in its efficient saturation region when the logic signal is high thereby programming a fuse connected to the programming transistor.

In a further embodiment, a method for providing chip identification on an integrated circuit chip includes steps of: scanning a sequence of bits into a scan chain of memory bitcells. At least one particular first memory bitcell of the scan chain has a first logic gate circuit, a first programming transistor and a first fuse. The method further includes steps of: feeding a first bit of the sequence of bits to a first input to the first logic gate circuit; operating the first logic gate circuit to provide a first logic signal to the first programming transistor; and operating the first programming transistor in its efficient saturation region when the first logic signal is high thereby programming the first fuse connected to the first programming transistor.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, embodiments of the present invention provide non-volatile memory and programming for integrated circuit chips, which may be used in a wide variety of devices and systems, including computers, processors, controllers and communications systems, in particular, mobile communications systems including, for example, cellphones. For example, embodiments may be useful for several functions such as array redundancy (e.g., for large cache memories in microprocessor chips), electronic chip identification, part number identification, and thermal diode calibration. Chip identification, for example, may have a wide variety of uses, including vendor tracking for purposes of inventory and quality control, allowing tracking, for example, of where and when a chip was manufactured and what features are enabled on the chip. Chip identification could also be used to provide a number of security features such as a unique consumer identification (ID) entered by the consumer or retailer at time of sale to uniquely identify a phone containing the chip for purposes of, for example, financial transactions, or to provide a password or access code preventing unauthorized use of a device containing the chip, for example. There may be, of course, many more such uses for unique chip ID's, and a number of chip ID's serving different purposes could even be provided on the same chip. Also for example, a chip may be designed with "debug" features that are useful for product development but which would not be desirable to be functional after the chip is placed in production. An embodiment could be used, for example, to disable such features for production chips. In addition, an embodiment could be used to provide security features such as passwords and access codes that are unique to each chip and programmable, for example, by the manufacturer of a product or by its consumer. A number of these different functions could be implemented on the same integrated circuit chip and included, for example, in a mobile communications device such as a cellphone.

In one embodiment, the area of non-volatile memory circuit elements can be significantly reduced both by reducing the area of transistors and by combining the function of two transistors into one (e.g. the embodiment uses one transistor to perform an equivalent function requiring two transistors in the prior art). For example, one embodiment reduces area by combining the sense transistor and the protection transistor into one sense transistor so that no more than one transistor is used in the fuse-sensing circuit.

The area of a memory bitcell typically is dominated by the width of the programming transistor because the programming transistor is the largest device in the bitcell. Therefore, area of the memory bitcell can be significantly reduced by reduction of the programming transistor size. One embodiment of the present invention, unlike the prior art which operates the programming transistor in the inefficient saturation region, may operate the programming transistor in the efficient saturation region thereby allowing the programming transistor size to be reduced. For example, "inefficient saturation" may occur when $V_{DS} \gg V_{GS} - V_T$ (i.e., drain-source voltage is much greater than the excess of gate-source voltage over the threshold voltage) because the gate is under-driven. In contrast, "efficient saturation" may occur when $V_{DS} > V_{GS} - V_T$ (i.e., drain-source voltage is just greater than the excess of gate-source voltage over the threshold voltage) because the gate is well driven. "Inefficient saturation" is inefficient because the designer may have to resort to increasing the transistor size, the drain-source voltage $V_{DS}$, or both, to obtain sufficient current for programming (e.g., blowing) the fuse. Thus, one embodiment of the present invention may reduce programming transistor width from about 40 microns to about 24 microns. Another embodiment may reduce overall bitcell area from about 184.85 square microns to about 98.53 square microns—providing approximately a 47% reduction in area. Yet another embodiment of the present invention may reduce programming voltage from a prior art typical value of 3.5 V (which is greater than any voltage that is naturally available on the chip) to a nominal value of about 2.6 V (which is the I/O (input/output) voltage that is available on the chip).

Figure 3:
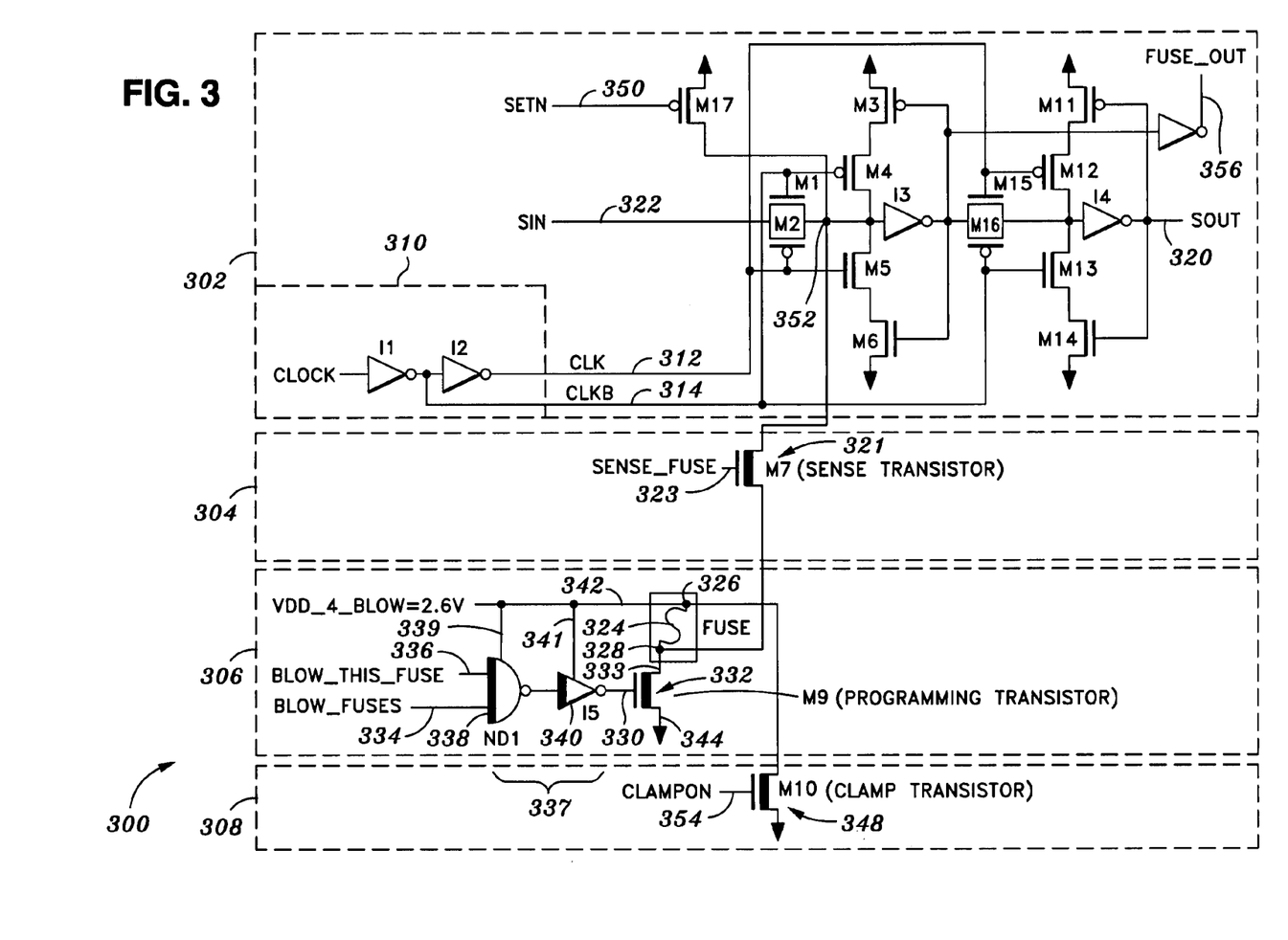
FIG. 3 is a schematic circuit diagram illustrating an exemplary memory bitcell according to one embodiment of the present invention.

Referring now to FIG. 3, memory bitcell 300 is illustrated in accordance with one embodiment of the present invention. FIG. 3 shows a memory bitcell 300 for writing, storing, and reading one bit of information. FIG. 3 differs generally from FIGS. 1 and 2 in the reduction, just described above, of the number of fuse-sensing circuit transistors and in the different circuitry and voltages used for operating the programming transistor in its efficient saturation region also just described above. Memory bitcell 300 may include circuitry for a scannable flip-flop, or latch, 302, fuse-sensing circuit 304, fuse-programming circuit 306, and clamp circuit 308. The description and operation of various features and elements—such as latch 302, fuse-sensing circuit 304, fuse-programming circuit 306, and clamp circuit 308—may be similar to correspondingly numbered features and elements shown in FIGS. 1 and 2—such as latch 102, fuse-sensing circuit 104, fuse-programming circuit 106, and clamp circuit 108, respectively Similarly, clock buffer 310, clock signal 312 and its complement 314 may correspond to clock buffer 110, clock signal 112 and its complement 114, respectively.

Figure 4:
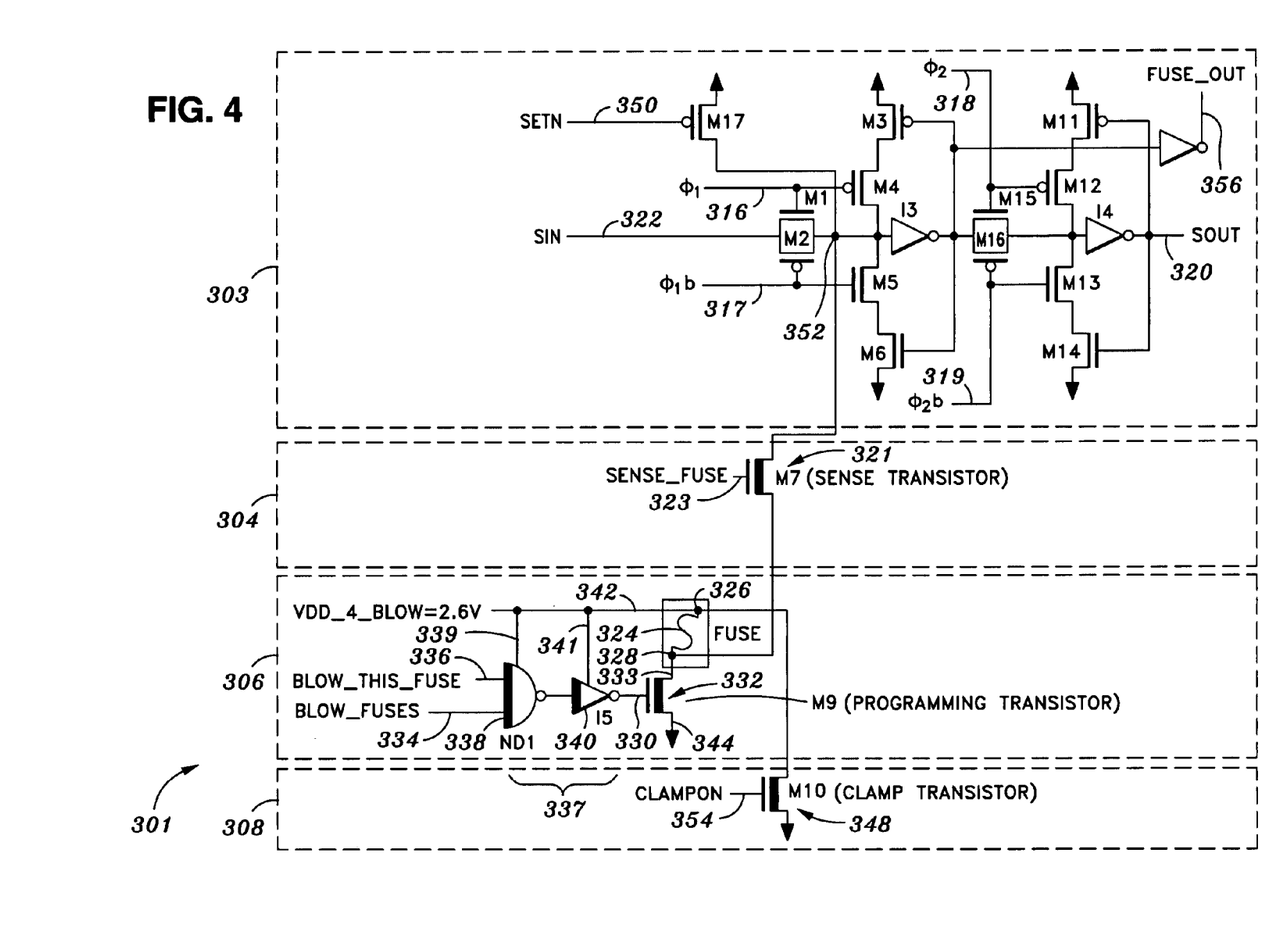
FIG. 4 is a schematic circuit diagram illustrating an exemplary memory bitcell according to another embodiment of the present invention.

FIG. 4 shows another memory bitcell 301, in accordance with another embodiment, which may use two-phase clock signaling as opposed to the single phase clock signaling used by the memory bitcell 300 shown in FIG. 3. Thus, FIG. 4 differs from FIG. 3 in the same manner that FIG. 2 differs from FIG. 1, and FIGS. 3 and 4 provide a similar comparison and contrast of embodiments of the present invention to prior art FIGS. 1 and 2. The description and operation of various features and elements—such as latch 303, clock signal 316 (labeled $\phi_1$ in FIG. 4) and its complement 317 ($\phi_1 b$) and clock signal 318 ($\phi_2$) and its complement 319 ($\phi_2 b$)—may be similar to correspondingly numbered features and elements shown in FIGS. 1 and 2, in particular FIG. 2—such as latch 103, clock signal 116 and its complement 117; and clock signal 118 and its complement 119.

Referring now to both FIGS. 3 and 4, the description and operation of various features and elements may be similar to correspondingly numbered features and elements in FIGS. 1 and 2. For example, output 320, sense transistor 321, input 322, fuse 324, terminals 326 and 328, gate 330 of programming transistor 332, and inputs 334 and 336 to NAND gate 338 and inverter 340 may correspond, respectively, to output 120, sense transistor 121, input 122, fuse 124, terminals 126 and 128, gate 130 of programming transistor 132, and inputs 134 and 136 to NAND gate 138 and inverter 140.

Fuse 324 may be programmed by providing an appropriate "on" or "off" logic signal at gate 330 of programming transistor 332 ("M9"). The logic signal at gate 330 may be provided, for example, as an AND operation provided, for example, by a logic gate circuit 337 comprising NAND gate 338 and inverter 340, logic circuit 337 having two inputs 334 and 336. Logic for blowing or not blowing fuses, e.g., programming fuse 324, may be as described above. Also, for example, fuse 324 can be programmed from a sequence of bits entered at input 322, by connecting output 356 ("FUSE_OUT") (which has the same logic value as SOUT output 320) to BLOW_THIS_FUSE input 336. Programming voltage 342 may be provided, for example, from a current source, e.g., a circuit capable of providing a broad range of current at the specified voltage, as known in the art. Sense transistor 321 and clamp transistor 348 should be off during fuse programming operations.

The logic used to drive programming transistor 332 may differ from prior art logic in that the logic signals of the present invention may be driven at a higher voltage than that of prior art logic signals, as indicated by connections 339 and 341 of NAND gate 338 and inverter 340 to VDD_4_BLOW programming voltage 342. The logic gates may also use thick oxide transistors, for example, as one possible implementation for operating the logic gates at the higher voltage, e.g., programming voltage 342. Using thick oxide transistors in logic gates 338, 340 is indicated in the figures by the thick dark bands on logic gates 338, 340. (Thick oxide transistors are indicated in the figures by a thick dark band used to represent the channel, and thin oxide transistors are indicated in the figures by a normal thickness line used to represent the channel.)

In contrast to prior art logic gates used to drive programming transistors at a nominal gate voltage of about 1.2 V, one embodiment of the present invention may use higher voltage logic to drive programming transistor 332 at a nominal gate voltage of about 2.6 V, the same as VDD_4_BLOW programming voltage 342, as seen in FIGS. 3 and 4. Thus, programming transistor 332 may be operated in its efficient saturation region (gate voltage and drain voltage approximately the same) allowing it to deliver more current at a lower voltage than prior art circuits.

For example, 10 mA of current is typically required, either in the prior art or in embodiments of the present invention, to flow through the fuse 324 and transistor 332 in order to blow the fuse 324. However, by operating transistor 332 in its efficient saturation region in accordance with the present invention, the fuse can be blown at a lower voltage (e.g., less than 3.0 V or nominally about 2.6 V as described above) compared to about 3.5 V typically required in the prior art. For example, when operated in the efficient saturation region the change in current through the transistor may be relatively great for a small change in voltage, whereas, relatively large changes in voltage are required for a relatively great change in current through the transistor when operated in the inefficient saturation region in accordance with the prior art. Thus, fuse 324 can be blown more efficiently when programming transistor 332 is operated in the efficient saturation region.

Also, because of the lower operating voltages and greater efficiency of operating in the efficient saturation region, the size of programming transistor 332 can be reduced (as described above) and sense transistor 321 does not need a protection transistor, so that a single thick oxide sense transistor 321, and no more than one transistor, may be used in fuse-sensing circuit 304 rather than two transistors (as in the prior art), further reducing the overall area occupied on the chip, also as described above.

After fuse 324 has been programmed, it may be desirable to determine the state of the fuse, i.e., whether fuse 324 is in a blown state or an unblown state, referred to as "sensing the fuse". To sense the fuse 324, pre-charge input 350 ("SETN") may be set low to turn transistor M17 on, applying a pre-charge voltage, also referred to more briefly as a pre-charge, at sense node 352 so that sense node 352 is high. At the same time, input 323 (SENSE_FUSE) and input 354 (CLAMPON) may be set high so that transistors 321 and 348 are both on, while gate 330 is held low so that programming transistor 332 is off. Thus, sense node 352 is provided a path to ground through fuse 324. Therefore, if fuse 324 is blown, sense node 352 may remain high (fuse 324 leaves the path to ground open) and if fuse 324 is unblown, sense node 352 may go low (fuse 324 closes the path to ground). Thus once SETN input 350 returns to high and sense transistor 321 is turned back off, sense node 352 can remain high if fuse 324 is in a blown state and sense node 352 can remain low if fuse 324 is in an unblown state.

In summary, if sense node 352 remains low (fuse 324 state is unblown), fuse output 356 ("FUSE_OUT") may become low (or "0"). If sense node 352 remains high (fuse 324 state is blown), fuse output 356 may become high (or "1"). Because fuse output 356 and latch output 320 may always have the same logic value, the state of all the fuses 324 can be read out as a sequence from the output 320 of a scan chain of latches 302 or 303 chained together.

Figure 5:
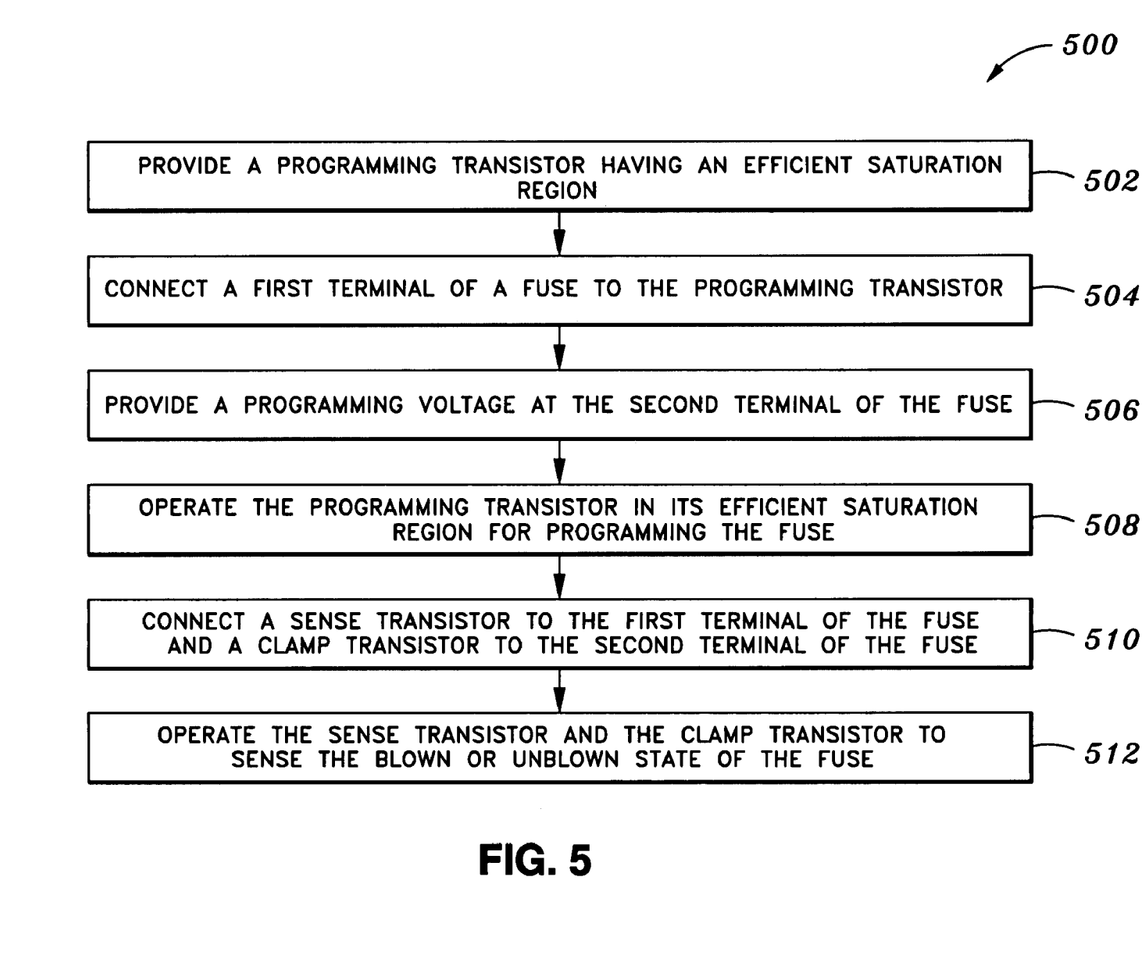
FIG. 5 is a flow chart illustrating a method for programming and sensing an electronic fuse in accordance with one embodiment of the present invention.

FIG. 5 illustrates a method 500 for programming and sensing an electronic fuse which may be included, for example, in a memory bitcell such as bitcell 302 or 303. At step 502, a programming transistor, which is capable of being operated in its efficient saturation region—such as reduced area programming transistor 332 may be provided on a chip. At step 504, the programming transistor 332 may be connected to a first terminal 328 of a fuse 324. At step 506, a first voltage—such as voltage 342—may be provided at a second terminal 326 of fuse 324, the first voltage being nominally the same as a logic voltage of logic gates—such as gates 338, 340—used to drive gate 330 of programming transistor 332 so that, at step 508, programming transistor 332 may be operated in its efficient saturation region when programming (e.g., blowing) fuse 324. At step 510, method 500 may continue with a step for sensing a programmed fuse—such as fuse 324—by providing and connecting a sense transistor 321 to the first terminal 328 of the fuse 324 and a clamp transistor 348 to the second terminal 326 of fuse 324. The state (e.g. blown or unblown) of fuse 324 may then be sensed at step 512 by operating sense transistor 321 and clamp transistor 348 in conjunction with a SETN input 350.

It should be understood, of course, that the foregoing relates to exemplary embodiments of the invention and that modifications may be made without departing from the spirit and scope of the invention as set forth in the following claims.

I claim:

1. A memory bitcell comprising:
a programming transistor having an efficient saturation region;
a fuse connected to said programming transistor at a first terminal of said fuse; and
a connection of said fuse to a programming voltage wherein:
said programming voltage is connected to said fuse at a second terminal of said fuse; and
said programming voltage is used to drive said programming transistor in said efficient saturation region.

2. The memory bitcell of claim 1, further comprising:
a logic gate connected to a gate of said programming transistor, and wherein said logic gate is operated at said programming voltage.

3. The memory bitcell of claim 1, wherein:
said programming voltage is approximately the same as the drain voltage of said programming transistor.

4. The memory bitcell of claim 1, further comprising:
a fuse-sensing circuit having a single sense transistor connected to said first terminal of said fuse.

5. The memory bitcell of claim 1, further comprising:

a latch having an input and an output; and a logic gate circuit connected to a gate of said programming transistor, wherein said output of said latch is connected to an input of said logic gate circuit.

6. A memory bitcell comprising:

a latch circuit having a sense node;

a fuse-programming circuit having a fuse with a first terminal connected to a programming voltage;

a fuse-sensing circuit having no more than one transistor, said fuse-sensing circuit having a single sense transistor connected to said sense node and connected to said fuse at a second terminal of said fuse; and a clamp circuit having a clamp transistor connected at said first terminal of said fuse to said fuse and to said programming voltage.

7. The memory bitcell of claim 6 wherein:

a pre-charge on said sense node is provided a path to ground through said fuse when said single sense transistor and said clamp transistor are turned on;

said sense node remains high when said fuse is in a blown state; and said sense node goes low when said fuse is in an unblown state.

8. The memory bitcell of claim 6 wherein:

a logic value corresponding to a state of said fuse appears at a latch output of said latch when said fuse-sensing circuit is operated.

9. The memory bitcell of claim 6, further comprising:

a programming transistor connected to said second terminal of said fuse, said programming transistor being turned off when said fuse-sensing circuit is operated.

10. The memory bitcell of claim 6, further comprising:

a programming transistor having a drain connected to said second terminal of said fuse, so that the drain voltage of said programming transistor is the same as the programming voltage; and said programming transistor is operated at the same gate voltage as said programming voltage so that the gate voltage of said programming transistor is the same as the drain voltage and said programming transistor operates in its efficient saturation region when programming said fuse.

11. The memory bitcell of claim 6, further comprising:

a programming transistor having a width of approximately 24 microns.

12. An integrated circuit chip comprising:

a plurality of memory bitcells, at least one of said plurality of memory bitcells having:

a latch having a sense node;

a programming transistor having an efficient saturation region;

a fuse connected to said programming transistor at a first terminal of said fuse;

a current source providing a programming voltage connected to said fuse at a second terminal of said fuse;

a logic gate circuit connected to the gate of said programming transistor, and wherein said logic gate circuit is operated at said programming voltage so that said logic gate circuit drives said programming transistor in said efficient saturation region when programming said fuse;

a fuse-sensing circuit having no more than one transistor, said fuse-sensing circuit having a single sense transistor connected to said sense node and connected to said fuse at a second terminal of said fuse; and a clamp circuit having a clamp transistor connected at said first terminal of said fuse to said fuse and to said programming voltage.

13. The integrated circuit chip of claim 12 wherein said plurality of memory bitcells are connected as a scan chain.

14. A non-volatile memory, comprising:

means for operating a programming transistor in an efficient saturation region, wherein said programming transistor draws a current through a fuse, blowing said fuse; and means for sensing a state of said fuse by connecting a sense node of a latch to said fuse using no more than one transistor.

* * * * *